(12) United States Patent
Kawada et al.

(10) Patent No.: US 9,418,840 B2
(45) Date of Patent: Aug. 16, 2016

(54) SILICON CARBIDE SEMICONDUCTOR DEVICE MANUFACTURING METHOD AND SILICON CARBIDE SEMICONDUCTOR DEVICE

(71) Applicant: FUJI ELECTRIC CO., LTD., Kawasaki (JP)

(72) Inventors: Yasuyuki Kawada, Tsukuba (JP); Yoshiyuki Yonezawa, Tsukuba (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/845,265

(22) Filed: Sep. 3, 2015

(65) Prior Publication Data

US 2015/0380243 A1 Dec. 31, 2015

Related U.S. Application Data (63) Continuation of application No. PCT/JP2014/065856, filed on Jun. 16, 2014.

(30) Foreign Application Priority Data

Jul. 9, 2013 (JP) ................................ 2013-144044

(51) Int. Cl.
*H01L 21/00* (2006.01)
*H01L 21/02* (2006.01)
(Continued)

(52) U.S. Cl.
CPC .......... *H01L 21/02529* (2013.01); *C23C 16/42* (2013.01); *C30B 25/02* (2013.01);
(Continued)

(58) Field of Classification Search
CPC .................. H01L 21/02529; H01L 21/02378; H01L 21/02576; H01L 21/0262; H01L 29/1608
See application file for complete search history.

(56) References Cited

U.S. PATENT DOCUMENTS 5,679,153 A * 10/1997 Dmitriev ................. C30B 19/04
117/106
8,536,582 B2 * 9/2013 Zhang ..................... C30B 23/02
257/77
(Continued)

FOREIGN PATENT DOCUMENTS

JP S63-25914 A 2/1988
JP 2000-319099 A 11/2000
(Continued)

OTHER PUBLICATIONS

S. Leone et al., "Growth of smooth 4H-SiC epilayers on 4° off-axis substrates with chloride-based CVD at very high growth rate", Materials Research Bulletin, vol. 46, No. 8, Aug. 2011, pp. 1272-1275.
(Continued)

*Primary Examiner* — Nicholas Tobergte
(74) *Attorney, Agent, or Firm* — Rabin & Berdo, P.C.

(57) ABSTRACT

Silicon-containing gas, carbon-containing gas, and chlorine-containing gas are introduced into a reacting furnace. Next, a SiC epitaxial film is grown on the front surface of a 4H-SiC substrate by a halide CVD method in a mixed gas atmosphere made of the plurality of gasses introduced. In the SiC epitaxial film growing, a SiC epitaxial film of a first predetermined thickness is grown at a first growth rate. The first growth rate is increased from an initial growth rate to a higher growth rate. Furthermore, the SiC epitaxial film is grown, at a second growth rate, until the thickness of the SiC epitaxial film reaches a second predetermined thickness. By so doing, it is possible to improve the crystallinity of a silicon carbide semiconductor film grown in a gas atmosphere containing halide.

17 Claims, 6 Drawing Sheets

(51) Int. Cl.
- *C30B 25/16* (2006.01)
- *C23C 16/42* (2006.01)
- *C30B 29/36* (2006.01)
- *C30B 25/02* (2006.01)
- *H01L 29/16* (2006.01)

(52) U.S. Cl.
CPC ............... *C30B 25/16* (2013.01); *C30B 29/36* (2013.01); *H01L 21/0262* (2013.01); *H01L 21/02378* (2013.01); *H01L 21/02576* (2013.01); *H01L 29/1608* (2013.01)

(56) References Cited

U.S. PATENT DOCUMENTS

| | | | | |
|---|---|---|---|---|
| 9,018,639 | B2 * | 4/2015 | Loboda | H01L 21/02035 257/77 |
| 2006/0011128 | A1 * | 1/2006 | Ellison | C30B 25/02 117/84 |
| 2007/0221119 | A1 * | 9/2007 | Kimoto | C23C 16/325 117/84 |
| 2009/0085044 | A1 * | 4/2009 | Ohno | H01L 21/02378 257/77 |
| 2010/0072485 | A1 * | 3/2010 | Suda | B82Y 20/00 257/77 |
| 2011/0278596 | A1 * | 11/2011 | Aigo | C23C 16/325 257/77 |
| 2012/0018740 | A1 * | 1/2012 | Takahashi | H01L 29/0847 257/77 |
| 2014/0117381 | A1 | 5/2014 | Kang et al. | |

FOREIGN PATENT DOCUMENTS

| | | |
|---|---|---|
| JP | 2003-034867 A | 2/2003 |
| JP | 2006-028016 A | 2/2006 |
| JP | 2013-239606 A | 11/2013 |
| JP | 2014-093526 A | 5/2014 |

OTHER PUBLICATIONS

A Fissel, "High-quality SiC epitaxial layers and low-dimensional heteropolytypic SiC structures grown by solid-source MBE", Journal of Crystal Growth, vol. 227-228, Jul. 2001, pp. 805-810.

* cited by examiner

SILICON CARBIDE SEMICONDUCTOR DEVICE MANUFACTURING METHOD AND SILICON CARBIDE SEMICONDUCTOR DEVICE

This application is a continuation under 35 U.S.C. 120 of International Application PCT/JP2014/065856 having the International Filing Date of Jun. 16, 2014, and having the benefit of the earlier filing date of Japanese Application No. 2013-144044, filed Jul. 9, 2013. Each of the identified applications is fully incorporated herein by reference.

TECHNICAL FIELD

The present invention relates to a silicon carbide semiconductor device manufacturing method and a silicon carbide semiconductor device.

BACKGROUND ART

As a semiconductor material, a compound semiconductor, such as a silicon carbide four-layer period hexagonal crystal (4H-SiC), is publicly known. When fabricating a power semiconductor device using 4H-SiC as a semiconductor material, a SiC single crystal substrate is fabricated by epitaxially growing a 4H-SiC single crystal film (hereafter referred to as a SiC epitaxial film) on a semiconductor substrate made of 4H-SiC (hereafter referred to as a 4H-SiC substrate). Heretofore, as an epitaxial growth method, a chemical vapor deposition (CVD) method is publicly known.

Specifically, a SiC single crystal substrate on which is stacked a SiC epitaxial film formed by a chemical vapor deposition method is fabricated by thermally decomposing source gas, caused to flow into a reacting furnace (chamber), in carrier gas, and continuously depositing silicon (Si) atoms along with the crystal lattice of a 4H-SiC substrate. In general, as the source gas, monosilane ($SiH_4$) gas and dimethylmethane ($C_3H_8$) gas are used, and as the carrier gas, hydrogen ($H_2$) gas is used. Also, as doping gas, nitrogen ($N_2$) gas or trimethylaluminum (TMA) gas is appropriately added.

In general, an epitaxial film, having a growth rate of on the order of several μm/h, cannot be grown at a high rate. Consequently, it takes significant time to grow an epitaxial film of a thickness of 100 μm or more required for fabricating a high voltage device, and an increase in epitaxial growth rate is required in terms of industrial production. As a method of growing an epitaxial film at a high rate, a halide CVD method using halide is publicly known. It is proposed that growth at a high rate of on the order of 100 μm/h is possible by a halide CVD method whereby monosilane gas and dimethylmethane gas acting as source gas, and gas containing chloride (Cl) such as hydrogen chloride gas (HCl) acting as additive gas are simultaneously introduced into a reacting furnace to grow a SiC epitaxial film (for example, refer to the following non-patent literature 1).

CITATION LIST

Non Patent Literature

Non-Patent Literature 1: S. Leone and five others, Growth of smooth 4H-SiC epilayers on 4° off-axis substrates with chloride-based CVD at very high growth rate, Materials Research Bulletin, (the Netherlands), Elsevier Ltd., 2011, Vol. 46, No. 8, pp. 1272 to 1275

However, as a result of the inventors' accumulation of serious studies, it is revealed that the crystallinity of a SiC epitaxial film grown by a halide CVD method is inferior to the crystallinity of a SiC epitaxial film grown by a normal CVD method using no halide.

SUMMARY

The invention, in order to solve the heretofore described problem of the heretofore known technology, has for its object to provide a silicon carbide semiconductor device manufacturing method, and a silicon carbide semiconductor device, which enable an improvement in the crystallinity of a silicon carbide semiconductor film grown in a gas atmosphere containing halide.

In order to solve the heretofore described problem and achieve the object of the invention, the silicon carbide semiconductor device manufacturing method according to the invention is a silicon carbide semiconductor device manufacturing method whereby a silicon carbide epitaxial film is grown on a silicon carbide semiconductor substrate by a chemical vapor deposition method using a mixed gas atmosphere made of silicon-containing gas, carbon-containing gas, and chlorine-containing gas, and the method has the following features. Firstly, a first growth step which grows the silicon carbide epitaxial film, while increasing a first growth rate at a constant rate, until the thickness of the silicon carbide epitaxial film reaches a first predetermined thickness, is carried out. Next, a second growth step which grows the silicon carbide epitaxial film at a second growth rate equal to or higher than the first growth rate, which is at the end of the first growth step, after the first growth step until the thickness of the silicon carbide epitaxial film reaches a second predetermined thickness larger than the first predetermined thickness, is carried out.

Also, the silicon carbide semiconductor device manufacturing method according to the invention is characterized in that in the heretofore described aspect of the invention, the first predetermined thickness is set to 2 μm or more and 7.2 μm or less, and that the second growth rate is set to 75 μm/h or more.

Also, the silicon carbide semiconductor device manufacturing method according to the invention is characterized in that in the heretofore described aspect of the invention, in the first growth step, the first growth rate is increased by 12 μm/h or less for each increment.

Also, the silicon carbide semiconductor device manufacturing method according to the invention is characterized in that in the heretofore described aspect of the invention, an X-ray rocking curve half-width of the (0002) face of the silicon carbide epitaxial film after the second growth step, which is measured by an X-ray diffraction method, is equal to or smaller than an X-ray rocking curve half-width of the (0002) face of the silicon carbide semiconductor substrate, which is measured by an X-ray diffraction method.

Also, the silicon carbide semiconductor device manufacturing method according to the invention is characterized in that in the heretofore described aspect of the invention, an X-ray rocking curve half-width of the (0002) face of the silicon carbide epitaxial film after the second growth step, which is measured by an X-ray diffraction method, is 0.008° or less.

Also, the silicon carbide semiconductor device manufacturing method according to the invention is characterized in that in the heretofore described aspect of the invention, the silicon carbide semiconductor substrate is a four-layer period hexagonal crystal substrate, the (0001) face of which is inclined on the order of 4° with respect to a crystal axis.

Also, in order to solve the heretofore described problem and achieve the object of the invention, the silicon carbide semiconductor device according to the invention has the following features. A silicon carbide epitaxial film grown on a silicon carbide semiconductor substrate by a chemical vapor deposition method using a mixed gas atmosphere made of silicon-containing gas, carbon-containing gas, and chlorine-containing gas, is provided. An X-ray rocking curve half-width of the (0002) face of the silicon carbide epitaxial film, which is measured by an X-ray diffraction method, is equal to or smaller than an X-ray rocking curve half-width of the (0002) face of the silicon carbide semiconductor substrate, which is measured by an X-ray diffraction method.

Also, the silicon carbide semiconductor device according to the invention is characterized in that in the heretofore described aspect of the invention, an X-ray rocking curve half-width of the (0002) face of the silicon carbide epitaxial film, which is measured by an X-ray diffraction method, is 0.008° or less.

Also, the silicon carbide semiconductor device according to the invention is characterized in that in the heretofore described aspect of the invention, the silicon carbide semiconductor substrate is a four-layer period hexagonal crystal substrate, the (0001) face of which is inclined on the order of 4° with respect to the crystal axis.

Advantageous Effects of Invention

According to the silicon carbide semiconductor device manufacturing method and silicon carbide semiconductor device according to the invention, the advantageous effect of it being possible to grow a silicon carbide semiconductor film having a high crystallinity substantially equal to the crystallinity of a silicon carbide substrate, at a high rate, using a chemical vapor deposition method using a gas atmosphere containing halide, is produced.

DETAILED DESCRIPTION

Hereafter, a detailed description will be given, referring to the accompanying drawings, of a preferred embodiment of a silicon carbide semiconductor device manufacturing method and silicon carbide semiconductor device according to the invention. In the present specification and the accompanying drawings, n or p in layers and regions prefixed with n or p means respectively that electrons or holes are majority carriers. Also, + and − suffixed to n or p respectively mean a higher impurity concentration and lower impurity concentration than in layers and regions affixed with neither + nor −. In the following description of the embodiment and the accompanying drawings, the same signs are given to like components, thus omitting a redundant description.

(Embodiment)

Figure 1A:
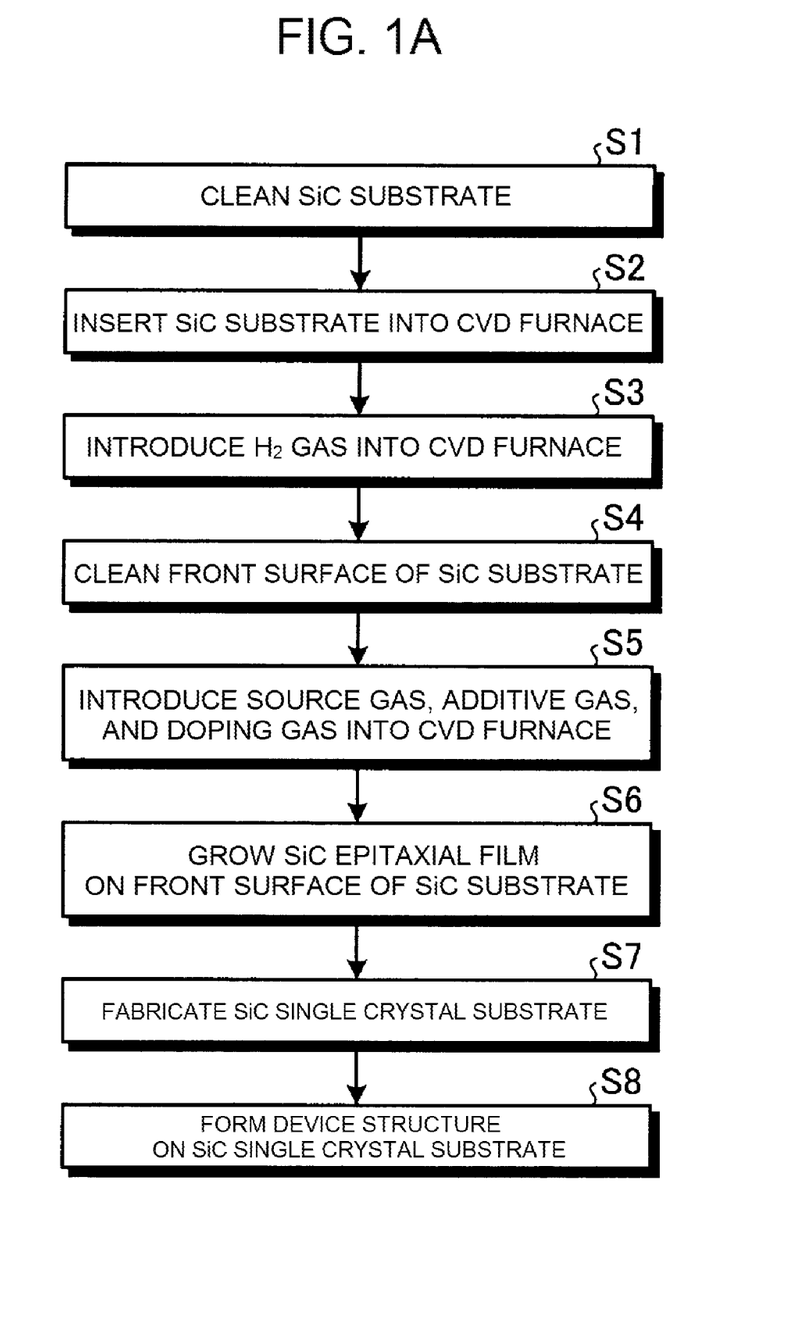
FIG. 1A is a flow chart showing an outline of a silicon carbide semiconductor device manufacturing method according to an embodiment.
Figure 1B:
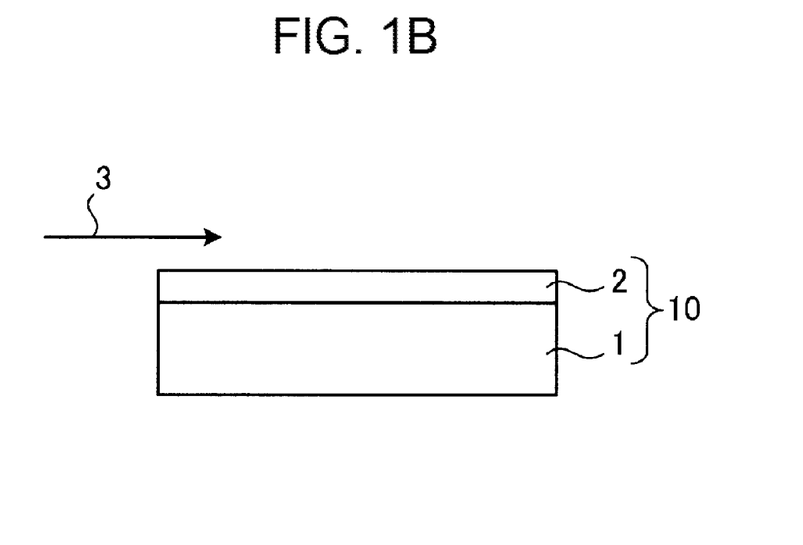
FIG. 1B is a sectional view showing a condition of the silicon carbide semiconductor device according to the embodiment in the process of being manufactured.

A silicon carbide semiconductor device manufacturing method according to an embodiment will be described by taking as an example the case of fabricating (manufacturing) a silicon carbide semiconductor device using a four-layer period hexagonal crystal of silicon carbide (4H-SiC) as a semiconductor material. FIG. 1A is a flow chart showing an outline of the silicon carbide semiconductor device manufacturing method according to the embodiment. FIG. 1B is a sectional view showing a condition of a silicon carbide semiconductor device according to the embodiment in the process of being manufactured. Firstly, a substrate made of 4H-SiC (a 4H-SiC substrate) 1 is prepared, and cleaned by a common organic cleaning method or RCA cleaning method (step S1). As the 4H-SiC substrate 1, for example, a silicon carbide bulk substrate, which has as its principal surface a surface wherein a (0001) face (a so-called Si face) is inclined (off-angled), for example, on the order of 4° with respect to a crystal axis, may be used.

Next, the 4H-SiC substrate 1 is inserted into a reacting furnace (chamber, not shown) for growing a 4H-SiC single crystal film (hereafter referred to as a SiC epitaxial film (a silicon carbide semiconductor film)) 2 formed by a chemical vapor deposition (CVD) method (step S2). Next, the inside of the reacting furnace is evacuated to a vacuum of, for example, $1 \times 10^3$ Pa or less. Hydrogen ($H_2$) gas refined by a common refiner is introduced into the reacting furnace at a flow rate of, for example, 20 L/min, for 15 minutes, thus replacing the vacuum atmosphere in the reacting furnace with a hydrogen atmosphere (step S3). Next, the front surface of the 4H-SiC substrate 1 is cleaned by chemical etching using hydrogen gas (step S4).

Specifically, the cleaning of the front surface of the 4H-SiC substrate 1 in the step S4 is carried out in the following way. Firstly, the inside of the reacting furnace is heated by, for example, high frequency induction with the hydrogen gas remaining introduced into the reacting furnace at 20 L/min. Further, after the temperature in the reacting furnace is raised to, for example, 1600° C., the temperature in the reacting furnace is kept at this temperature for on the order of 10 minutes. By keeping the temperature in the reacting furnace in this way, the front surface of the 4H-SiC substrate 1 is dry etched by the hydrogen gas. By so doing, the front surface of the 4H-SiC substrate 1 is cleaned, and comes into a condition suitable for growing the epitaxial film. The temperature in the reacting furnace only has to be measured with, for example, a radiation thermometer and controlled.

Next, the temperature in the reacting furnace is adjusted so that the temperature of the 4H-SiC substrate 1 reaches a predetermined growth temperature for growing the SiC epitaxial film 2. Next, in a condition in which the hydrogen gas introduced in the step S3 is introduced as carrier gas, silicon (Si)-containing gas and carbon (C)-containing gas acting as source gas, chlorine (Cl)-containing gas acting as additive gas, and, for example, nitrogen ($N_2$) gas acting as doping gas are further introduced simultaneously into the reacting furnace (step S5). In FIG. 1B, the flows of the source gas, additive gas, doping gas, and carrier gas are collectively shown by the arrow 3.

Next, the SiC epitaxial film 2 is grown on the principal surface (front surface) of the 4H-SiC substrate 1 by a halide CVD method in a mixed gas atmosphere made of the source gas, additive gas, doping gas, and carrier gas introduced in the step S5 (step S6). In the step S6, firstly, the SiC epitaxial film 2 is grown, while a low initial growth rate (a first growth rate) at the start of growth is being increased at a constant rate, until a first predetermined thickness of the SiC epitaxial film 2 reaches, for example, on the order of 2.0 μm to 7.2 μm (from the start of growth (after 0 minutes elapse) until $t_1$ seconds elapse) (hereafter referred to as a first growth period). Subsequently, the SiC epitaxial film 2 is grown at a second growth rate equal to or higher than the first growth rate, which is at the end of the first growth period, until the thickness of the SiC epitaxial film 2 reaches a second predetermined thickness required for a product (when $t_2$ seconds elapse ($t_1 < t_2$) from the start of growth) (hereafter referred to as a second growth period). The SiC epitaxial film 2 is grown in this way, thereby fabricating a SiC single crystal substrate 10 wherein the SiC epitaxial film 2 is stacked on the 4H-SiC substrate 1 (step S7). Further, a predetermined device structure (not shown) is formed on the SiC single crystal substrate 10 (step S8), thereby completing the silicon carbide semiconductor device.

Conditions in the reacting furnace for growing the SiC epitaxial film 2 in the step S6 are as follows. The silicon-containing gas may be, for example, monosilane ($SiH_4$) gas, specifically, for example, monosilane gas diluted 50% by hydrogen gas (hereafter referred to as $SiH_4/H_2$). The carbon-containing gas may be, for example, dimethylmethane ($C_3H_8$) gas, specifically, for example, dimethylmethane gas diluted 20% by hydrogen gas (hereafter referred to as $C_3H_8/H_2$). The chlorine-containing gas may be, for example, hydrogen chloride (HCl) gas of a concentration of 100%.

In the mixed gas atmosphere in the reacting furnace, the flow rates of the silicon-containing gas and carbon-containing gas may be adjusted so that the ratio of the number of carbon atoms to the number of silicon atoms (=C/Si, hereafter referred to as a C/Si ratio) is, for example, 1.3. Furthermore, the flow rates of the silicon-containing gas and chlorine-containing gas may be adjusted so that the ratio of the number of chlorine atoms to the number of silicon atoms (=Cl/Si, hereafter referred to as a Cl/Si ratio) is, for example, 3.0. The SiC epitaxial film 2 may be grown for, for example, on the order of 20 minutes with the growth temperature as, for example, on the order of 1630° C.

Also, a specific method of controlling the first and second growth rates of the SiC epitaxial film 2 is, for example, as follows. In the first growth period (a first growth step), the first growth rate of the SiC epitaxial film 2 is continuously increased at a constant rate from a low initial growth rate of, for example, on the order of 3 μm/h (the first growth rate at the start of the first growth step) to a high growth rate of, for example, on the order of 75 μm/h (the first growth rate at the end of the first growth step). It is good that one time increment of the first growth rate (hereafter referred to as an initial growth rate increase rate) is, for example, on the order of 12 μm/h or less. Specifically, for example, it is supposed that the initial growth rate at the start of growth is set to 3 μm/h, and that the first growth rate is increased by 12 μm/h for each increment (the initial growth rate increase rate=12 μm/h) so that the first growth rate is 75 μm/h at the point at which the thickness of the SiC epitaxial film 2 reaches 2 μm. In this case, by increasing the first growth rate by 12 μm/h every 36 seconds, the first growth rate at the end of the first growth period, at which the SiC epitaxial film 2 reaches 2 μm, reaches 75 μm/h. That is, the SiC epitaxial film 2 starts to be epitaxially grown at an initial growth rate of 3 μm/h, and subsequently, the first growth rate is increased so as to be 15 μm/h in 36 seconds, 27 μm/h in 72 seconds, . . . , and $(12 \times n+3)$ μm/h in $(36 \times n)$ seconds (n=1 to 6). By so doing, the first growth rate is eventually 75 μm/h, and the time $t_1$ required from the start of growth of the SiC epitaxial film 2 to the end of the first growth period is 216 seconds. In the second growth period (a second growth step), it is good to set the second growth rate of the SiC epitaxial film. 2 to a high growth rate of, for example, on the order of 75 μm/h or more. By controlling the first and second growth rates in this way, it is possible to make the crystallinity of the SiC epitaxial film 2 grown on the 4H-SiC substrate 1 equal to the crystallinity of the 4H-SiC substrate 1.

Figure 2:
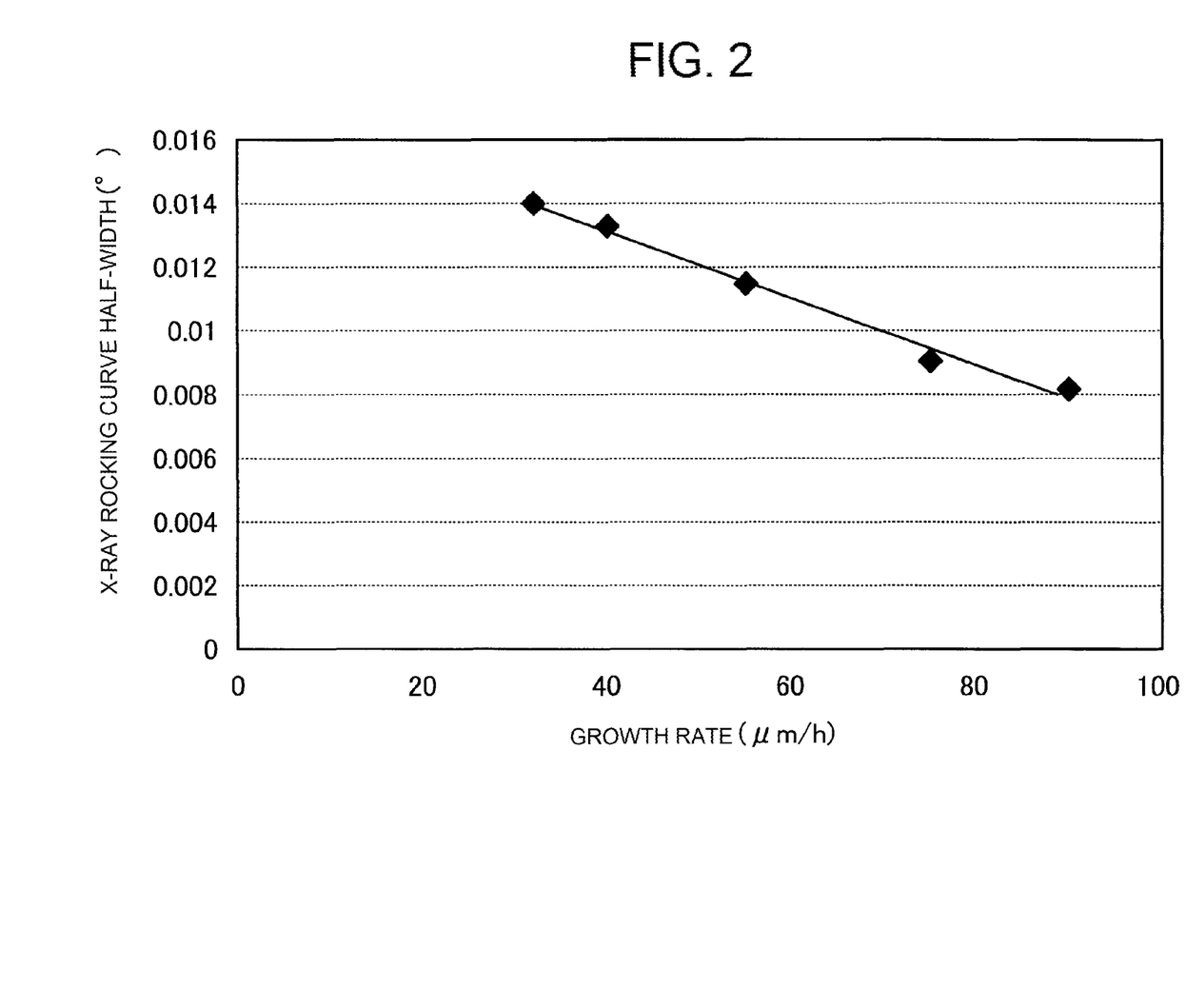
FIG. 2 is a characteristic diagram showing a relationship in growth rate and X-ray rocking curve half-width between SiC epitaxial films.

Next, a description will be given of the crystallinity of the SiC epitaxial film grown in accordance with the heretofore described semiconductor device manufacturing method according to the invention. Firstly, a description will be given of a relationship in growth rate and crystallinity between SiC epitaxial films. FIG. 2 is a characteristic diagram showing a relationship in growth rate and X-ray rocking curve half-width between SiC epitaxial films. As a verification specimen, a specimen wherein a SiC epitaxial film is grown at a high rate on a 4H-SiC substrate (hereafter referred to as a 4°-off substrate), which has as its principal surface a surface wherein the (0001) face is inclined on the order of 4° with respect to the crystal axis, at a constant growth rate from the start of growth by a halide CVD method, is fabricated (hereafter referred to as a working example 1). The gas flow rates in the reacting furnace when growing the SiC epitaxial film are set to 200 sccm for the $SiH_4/H_2$ gas, 166 sccm for the $C_3H_8/H_2$ gas, and 300 sccm for the HCl gas. Also, as the doping gas, $N_2$ gas is introduced with the flow rate adjusted so that the carrier concentration is $5 \times 10^{15}/cm^3$. With regard to the working example 1, a plurality of specimens different in SiC epitaxial film growth rate are fabricated, and the relationship in growth rate and crystallinity between the specimens is verified.

Specifically, with regard to each specimen of the working example 1, the x-ray rocking curve (XRC) half-width (hereafter referred to simply as the X-ray rocking curve FWHM) of the (0002) face of the SiC epitaxial film is measured using an X-ray diffraction (XRD) device, and the crystallinity of the SiC epitaxial film (crystal face spacing in a direction perpendicular to the principal surface of the substrate) is evaluated. Results of the evaluation are shown in FIG. 2. In FIG. 2, the X-ray rocking curve FWHM=0.008° refers to the X-ray rocking curve FWHM of the 4°-off substrate, and is a value which evaluates the crystallinity of the 4°-off substrate in the case of providing no SiC epitaxial film. It is confirmed from the results shown in FIG. 2 that when a SiC epitaxial film is grown on the principal surface of the 4°-off substrate using a halide CVD method, the crystallinity of the SiC epitaxial film is poor when the growth rate is low, and that the crystallinity of the SiC epitaxial film improves as the growth rate is increased, thus enabling the crystallinity of the SiC epitaxial film to approach the crystallinity of the 4°-off substrate.

It is confirmed that for example, when the growth rate of a SiC epitaxial film is set to 90 μm/h, the SiC epitaxial film has an X-ray rocking curve FWHM of 0.0082°, and can obtain crystallinity close to that of the 4°-off substrate. However, the SiC epitaxial film in this case is also 0.0002° wider in X-ray rocking curve FWHM than and inferior in crystallinity to the 4°-off substrate. The reason is as follows. In epitaxial growth using a halide CVD method, it is said that by adding hydrogen chloride (HCl) gas, monosilane ($SiH_4$) gas which is source gas becomes trichlorosilane ($SiHCl_3$) gas or the like, thus suppressing silicon (Si) aggregating. However, it is confirmed that when epitaxial growth is performed at a high growth rate of 90 μm/h or more by increasing the supply of source gas, silicon aggregates, and particles are generated in the reacting furnace. In this way, the higher the rate at which a SiC epitaxial film is grown, the more severe the contamination inside the reacting furnace, and the crystallinity of the SiC epitaxial film deteriorates. Furthermore, there arises a new problem that the maintenance period of the reacting furnace is shortened, thus reducing productivity.

Therefore, in epitaxial growth using a halide CVD method, a growth rate such that a SiC epitaxial film high in crystallinity can be grown at as high a rate as possible with the contamination inside the reacting furnace kept to a minimum, is verified. As a verification specimen, a specimen wherein a first growth rate of a first growth period from the start of growth (after 0 minutes elapse) until the thickness of a SiC epitaxial film reaches a first predetermined thickness of 2 µm is suppressed so as to be continuously increased at a constant rate, and subsequently, the SiC epitaxial film is grown at a high growth rate in a second growth period until the thickness of the SiC epitaxial film reaches a second predetermined thickness required for a product, is fabricated (hereafter referred to as a working example 2). The reason that the first predetermined thickness of the SiC epitaxial film grown in the first growth period is set to, for example, on the order of 2.0 µm to 7.2 µm, as heretofore described, is as follows. The larger the thickness of the SiC epitaxial film grown in the first growth period, the longer the time for which to grow the SiC epitaxial film at a low growth rate, causing a degradation in throughput. Meanwhile, the reason is that the advantageous effect of improving the crystallinity decreases when the thickness of the SiC epitaxial film grown in the first growth period is small. Other epitaxial growth conditions of the working example 2 are the same as those of the working example 1.

With regard to the working example 2, four specimens different in the initial growth rate increase rate when growing the SiC epitaxial film are fabricated. In each specimen of the working example 2, the initial growth rate at the start of growth is set to 3 µm/h, the first growth rate is continuously increased at a constant rate so as to be 75 µm/h at the end of the first growth period (when the thickness of the SiC epitaxial film reaches 2 µm), and the growth rate in the second growth period is set to 75 µm/h. Specifically, in the first specimen, the initial growth rate is increased by 6 µm/h for each increment in the first growth period (that is, the initial growth rate is increased for about 200 seconds (≈16.6 seconds×12)). In the second specimen, the initial growth rate is increased by 9 µm/h for each increment in the first growth period (that is, the initial growth rate is increased for about 209 seconds (≈26.1 seconds×8)). In the third specimen, the initial growth rate is increased by 12 µm/h for each increment in the first growth period (that is, the initial growth rate is increased for 216 seconds (=36 seconds×6)). In the fourth specimen, the initial growth rate is increased by 18 µm/h for each increment in the first growth period (that is, the initial growth rate is increased for 240 seconds (=60 seconds×4)).

Figure 3:
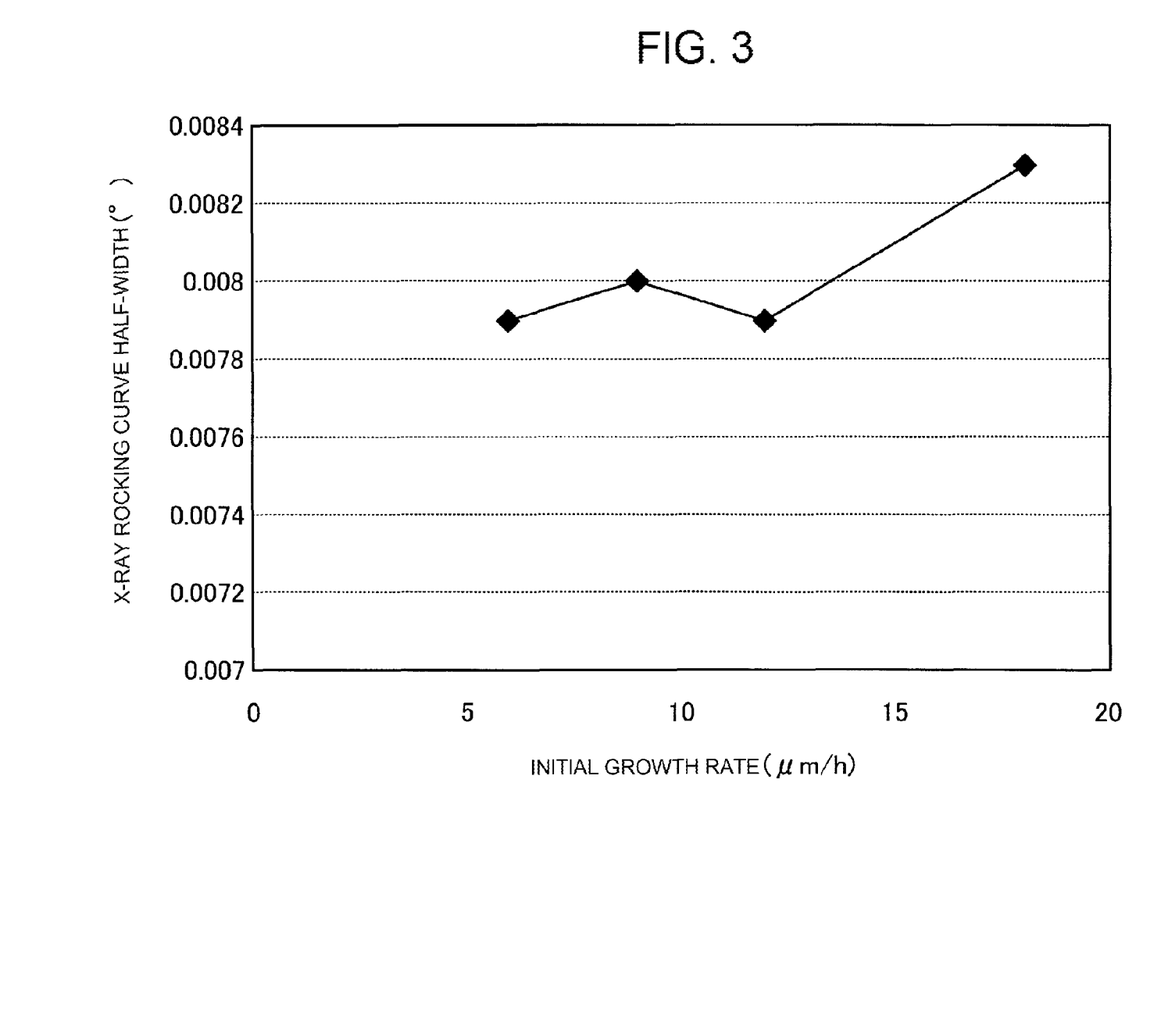
FIG. 3 is a characteristic diagram showing a relationship in initial growth rate increase rate and X-ray rocking curve half-width between SiC epitaxial films.

With regard to the four specimens of the working example 2, results from measuring the X-ray rocking curve FWHMs of the SiC epitaxial films are shown in FIG. 3. FIG. 3 is a characteristic diagram showing a relationship in initial growth rate increase rate and X-ray rocking curve half-width between the SiC epitaxial films. It is confirmed from the results shown in FIG. 3 that by setting the initial growth rate increase rate to 12 µm/h or less, it is possible to keep the X-ray rocking curve FWHM of the SiC epitaxial film to be 0.008° or less even though the growth rate in the second growth period is set to 75 µm/h, and thus possible to obtain crystallinity substantially equal to that of the 4°-off substrate. As opposed to this, it is confirmed that when the initial growth rate increase rate is increased to, for example, 18 µm/h, the X-ray rocking curve FWHM of the SiC epitaxial film is wide, and that the crystallinity of the SiC epitaxial film is inferior to that of the 4°-off substrate. Consequently, it is confirmed that by gradually increasing the initial growth rate, it is possible, even though the growth rate in the second growth period is subsequently set to on the order of 75 µm/h, to make the crystallinity higher than when the SiC epitaxial film is grown at a growth rate of 90 µm/h from the start of growth, and that it is possible to obtain a SiC epitaxial film having crystallinity substantially equal to that of the 4°-off substrate.

Figure 4:
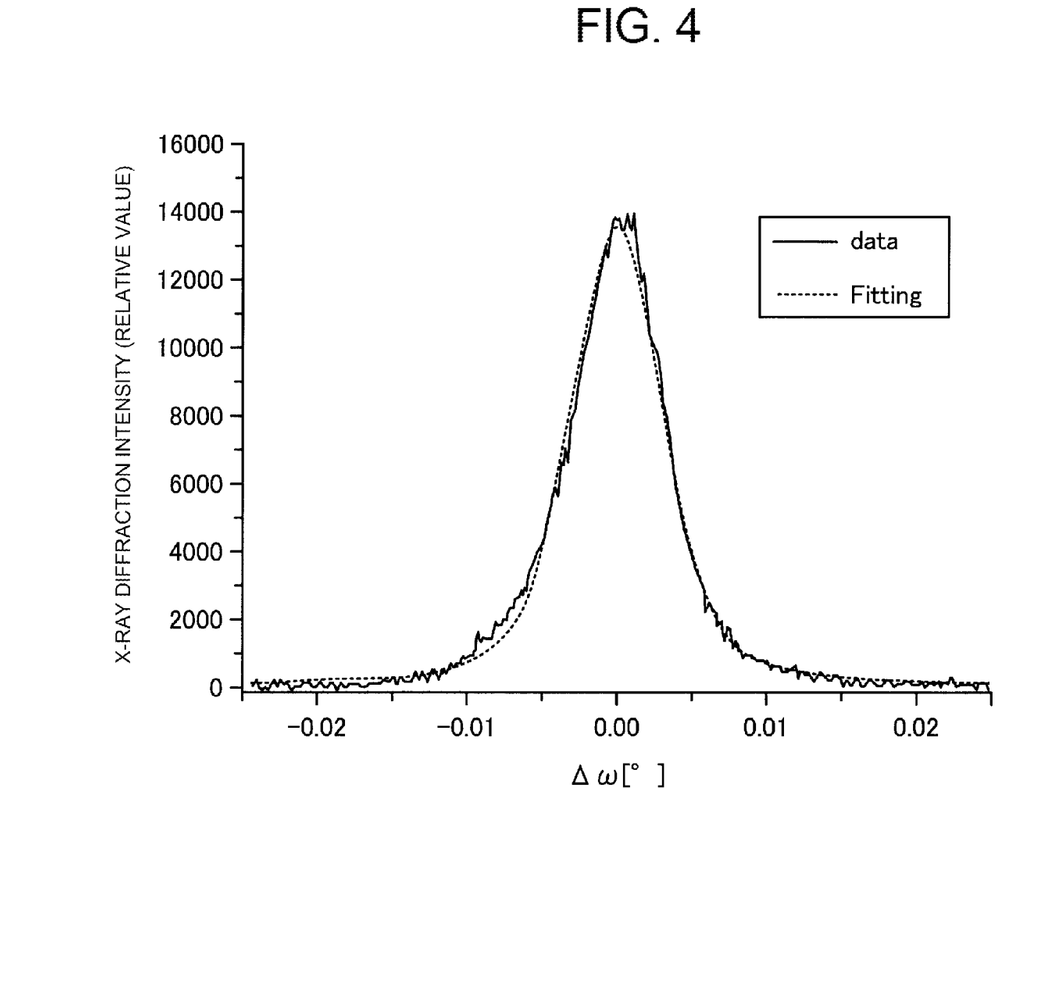
FIG. 4 is a characteristic diagram showing an X-ray rocking curve of a 4°-off substrate.
Figure 5:
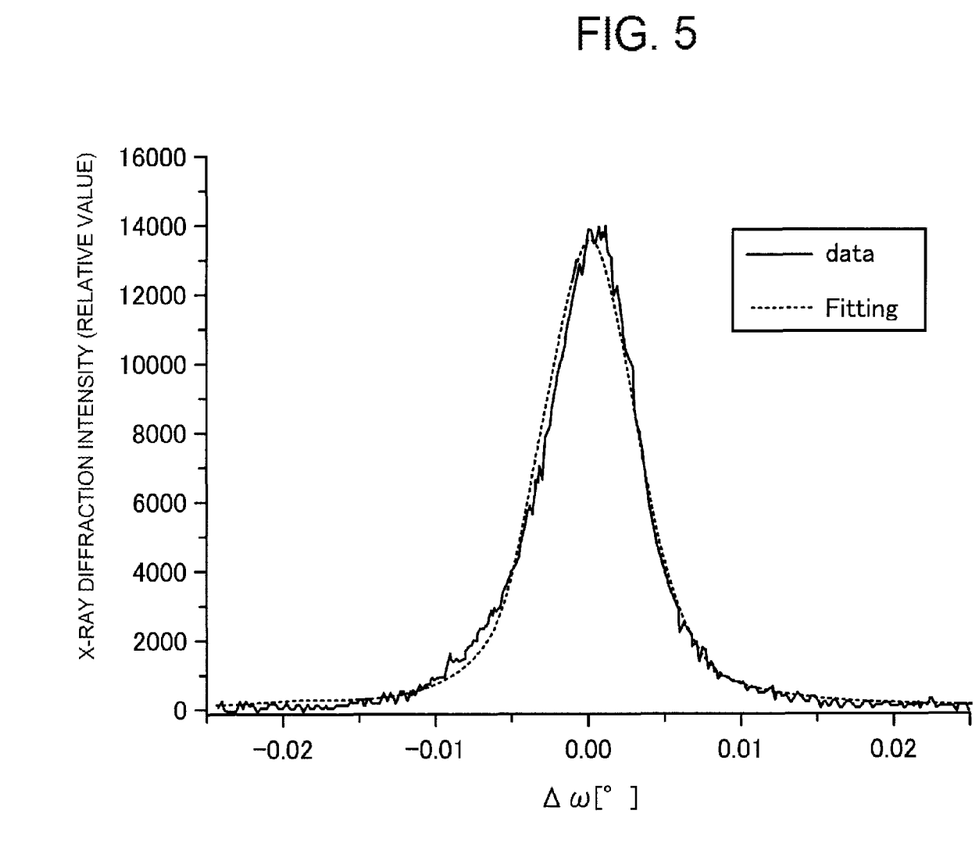
FIG. 5 is a characteristic diagram showing an X-ray rocking curve of a SiC epitaxial film in a semiconductor device according to a working example.

Next, with regard to a working example 3 wherein the initial growth rate increase rate is set to 12 µm/h, and by carrying out epitaxial growth for 20 minutes at a second growth rate of 75 µm/h, a SiC epitaxial film is grown until a second predetermined thickness required for a product reaches 27 µm, a result from measuring the X-ray rocking curve of the (0002) face of the SiC epitaxial film is shown in FIG. 5. Also, as a comparison, a result from measuring the X-ray rocking curve of the (0002) face of a 4°-off substrate is shown in FIG. 4. FIG. 4 is a characteristic diagram showing the X-ray rocking curve of the 4°-off substrate. FIG. 5 is a characteristic diagram showing the X-ray rocking curve of the SiC epitaxial film in a semiconductor device according to the working example. Other epitaxial growth conditions of the working example 3 are the same as those of the working example 2. It is confirmed from the results shown in FIGS. 4 and 5 that both the working example 3 and the 4°-off substrate form the X-ray rocking curve of substantially the same shape, and that the SiC epitaxial film grown in accordance with the semiconductor device manufacturing method according to the heretofore described embodiment is high in crystallinity compared well with the 4°-off substrate. Also, as shown in FIGS. 4 and 5, as a result of fitting to the respective (0002) face X-ray rocking curves, measured on the SiC epitaxial film of the working example 3 and the 4°-off substrate, based on a Gaussian function, it is confirmed that a theoretical X-ray rocking curve calculated from the fitting forms substantially the same shape as the measurement result. Therefore, it is confirmed that by appropriately setting the initial growth rate, the initial growth rate increase rate, and the first and second growth rates, as described in the semiconductor device manufacturing method according to the heretofore described embodiment, it is possible to improve the crystallinity of the SiC epitaxial film regardless of the difference in the second predetermined thickness required for a product.

As heretofore described, according to the embodiment, after the SiC epitaxial film is grown to the first predetermined thickness while the slow initial growth rate at the start of growth is being increased at a constant rate, the SiC epitaxial film is grown at the second growth rate equal to or higher than the first growth rate, which is at the end of the first growth period, until the thickness of the SiC epitaxial film reaches the second predetermined thickness required for a product, thereby enabling the SiC epitaxial film to be grown at as high a rate as possible, as well as enabling the crystallinity of the SiC epitaxial film to be improved to substantially the same level as the crystallinity of the 4H-SiC substrate. The improvement in the crystallinity of the SiC epitaxial film means that an occurrence of dislocation or defection, an impurity incorporation, or the like, in the SiC epitaxial film can be presumed to be reduced, and that the SiC epitaxial film is provided with a film quality favorable for itself. In this way, as it is possible to grow a high-quality SiC epitaxial film at a high rate, productivity improves, thus enabling an improvement in throughput.

In the above, the invention, not being limited to the heretofore described embodiment, can be variously modified without departing from the scope of the invention. For example, in the heretofore described embodiment, the finally attained rate of the first growth rate is set to 75 μm/h, but may be set to 75 μm/h or more, for example, a higher rate of on the order of 90 μm/h at which the X-ray rocking curve FWHM of the SiC epitaxial film is 0.0082°. Also, the heretofore described embodiment is also true in the same way whether the conductivity type is n-type or p-type.

INDUSTRIAL APPLICABILITY

As above, the silicon carbide semiconductor device manufacturing method and silicon carbide semiconductor device according to the invention are useful for the case of fabricating a transistor, a diode, or the like, with SiC as a semiconductor material, and for a semiconductor device fabricated using a SiC single crystal substrate formed by growing a SiC single crystal film on a SiC substrate.

REFERENCE SIGNS LIST 1 4H-SiC substrate
2 SiC epitaxial film
3 Gas introduced into reacting furnace
10 SiC single crystal substrate

What is claimed is:

1. A silicon carbide semiconductor device manufacturing method, whereby a silicon carbide epitaxial film is grown on a silicon carbide semiconductor substrate by a chemical vapor deposition method using a mixed gas atmosphere made of silicon-containing gas, carbon-containing gas, and chlorine-containing gas, comprising:
   a first growth step which grows the silicon carbide epitaxial film, while increasing a first growth rate at a constant rate, until a thickness of the silicon carbide epitaxial film reaches a first predetermined thickness; and
   a second growth step which grows the silicon carbide epitaxial film at a second growth rate equal to or higher than the first growth rate, which is at an end of the first growth step, after the first growth step until the thickness of the silicon carbide epitaxial film reaches a second predetermined thickness larger than the first predetermined thickness.

2. The silicon carbide semiconductor device manufacturing method according to claim 1, wherein
   the first predetermined thickness is set to 2 μm or more and 7.2 μm or less, and
   the second growth rate is set to 75 μm/h or more.

3. The silicon carbide semiconductor device manufacturing method according to claim 1, wherein
   in the first growth step, the first growth rate is increased by 12 μm/h or less for each of increments in the first growth rate.

4. The silicon carbide semiconductor device manufacturing method according to claim 1, wherein
   an X-ray rocking curve half-width of a (0002) face of the silicon carbide epitaxial film after the second growth step, which is measured by an X-ray diffraction method, is equal to or smaller than an X-ray rocking curve half-width of a (0002) face of the silicon carbide semiconductor substrate, which is measured by an X-ray diffraction method.

5. The silicon carbide semiconductor device manufacturing method according to claim 4, wherein
   an X-ray rocking curve half-width of the (0002) face of the silicon carbide epitaxial film after the second growth step, which is measured by an X-ray diffraction method, is 0.008° or less.

6. The silicon carbide semiconductor device manufacturing method according to claim 1, wherein
   the silicon carbide semiconductor substrate is a four-layer period hexagonal crystal substrate, an (0001) face of which is inclined on the order of 4° with respect to a crystal axis.

7. A silicon carbide semiconductor device, comprising:
   a silicon carbide epitaxial film grown on a silicon carbide semiconductor substrate by a chemical vapor deposition method using a mixed gas atmosphere made of silicon-containing gas, carbon-containing gas, and chlorine-containing gas, wherein
   an X-ray rocking curve half-width of a (0002) face of the silicon carbide epitaxial film, which is measured by an X-ray diffraction method, is equal to or smaller than an X-ray rocking curve half-width of a (0002) face of the silicon carbide semiconductor substrate, which is measured by an X-ray diffraction method; and
   the X-ray rocking curve half-width of the (0002) face of the silicon carbide epitaxial film, which is measured by the X-ray diffraction method, is 0.008° or less.

8. The silicon carbide semiconductor device according to claim 7, wherein
   the silicon carbide semiconductor substrate is a four-layer period hexagonal crystal substrate, a (0001) face of which is inclined on the order of 4° with respect to the crystal axis.

9. The silicon carbide semiconductor device manufacturing method according to claim 2, wherein
   the silicon carbide semiconductor substrate is a four-layer period hexagonal crystal substrate, an (0001) face of which is inclined on the order of 4° with respect to a crystal axis.

10. The silicon carbide semiconductor device manufacturing method according to claim 3, wherein
    the silicon carbide semiconductor substrate is a four-layer period hexagonal crystal substrate, an (0001) face of which is inclined on the order of 4° with respect to a crystal axis.

11. The silicon carbide semiconductor device manufacturing method according to claim 4, wherein
    the silicon carbide semiconductor substrate is a four-layer period hexagonal crystal substrate, an (0001) face of which is inclined on the order of 4° with respect to a crystal axis.

12. The silicon carbide semiconductor device according to claim 7, wherein
    the silicon carbide semiconductor substrate is a four-layer period hexagonal crystal substrate, a (0001) face of which is inclined on the order of 4° with respect to the crystal axis.

13. A method, comprising:
    growing a silicon carbide epitaxial film on a silicon carbide semiconductor substrate at a first growth rate for a first period of time, wherein the first growth rate increases at a constant rate starting from an initial growth rate until a first predetermined thickness of the silicon carbide epitaxial film is reached; and
    after the first predetermined thickness is reached, growing the silicon carbide epitaxial film on the silicon carbide semiconductor substrate at a second growth rate for a second period of time, wherein the second growth rate is equal to or higher than the first growth rate at an end of the first period of time, until a second predetermined thickness of the silicon carbide epitaxial film greater than the first predetermined thickness is reached.

14. The method of claim 13, wherein the growing the silicon carbide epitaxial film on the silicon carbide semiconductor substrate at the first growth rate includes incrementally increasing the initial growth rate in constant increments at predetermined intervals in the first period of time.

15. The method of claim 13, wherein the first growth rate obtains crystallinity substantially equal to that of a 4°-off substrate.

16. The method of claim 13, wherein the growing the silicon carbide epitaxial film on the silicon carbide semiconductor substrate at the first growth rate and the second growth rate comprises using a chemical vapor deposition method.

17. The method of claim 16, wherein the using the chemical vapor deposition method comprises using a mixed gas atmosphere including silicon-containing gas, carbon-containing gas and chlorine-containing gas.

* * * * *